United States Patent
Otaki

(10) Patent No.: US 6,610,590 B2
(45) Date of Patent: Aug. 26, 2003

(54) METHOD OF MANUFACTURING A LASER IMPRESSION ON A LOW THERMAL CONDUCTIVITY LAYER OF A SEMICONDUCTOR DEVICE

(75) Inventor: Mikio Otaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/151,156

(22) Filed: May 21, 2002

(65) Prior Publication Data

US 2002/0177294 A1 Nov. 28, 2002

(30) Foreign Application Priority Data

May 24, 2001 (JP) .................................... 2001-155148

(51) Int. Cl.$^7$ ............................................ H01L 21/44
(52) U.S. Cl. ........................ 438/612; 438/613; 438/617
(58) Field of Search ................................ 438/612, 613, 438/614, 617; 257/737, 738

(56) References Cited

U.S. PATENT DOCUMENTS 6,294,840 B1 * 9/2001 McCormick ................. 257/778
6,495,393 B2 * 12/2002 Blish et al. ................. 438/106

* cited by examiner

Primary Examiner—Carl Whitehead, Jr.
Assistant Examiner—Thanh Nguyen
(74) Attorney, Agent, or Firm—Volentine Francos, PLLC

(57) ABSTRACT

A low thermal conductivity layer is formed on a back surface of a semiconductor wafer or chip, and a laser impression is formed on the low thermal conductivity layer. The laser impression can be formed without damaging the device surface of the semiconductor wafer or chip due to exothermic heat of the laser impression.

24 Claims, 4 Drawing Sheets

METHOD OF MANUFACTURING A LASER IMPRESSION ON A LOW THERMAL CONDUCTIVITY LAYER OF A SEMICONDUCTOR DEVICE

BACKGROUND OF THE INVENTION

1. Field of the Invention

The present invention relates to a method of manufacturing a semiconductor device, and more particularly to a method of manufacturing a wafer-level chip size package (WCSP).

The present application claims priority under 35 U.S.C. §119 to Japanese Patent Application No. 2001-155148, filed May 24, 2001, which is herein incorporated by reference in its entirety for all purposes.

2. Description of the Related Art

The WCSP is one of semiconductor mold packages, a that has simple packaging. A plurality of pads are constructed for a plurality of semiconductor chips, are formed on a silicon substrate at the wafer-level. Then, bump electrodes for an assembly are formed, after wiring patterns connecting the pads are formed. Next, solder balls for packaging are formed on the bump electrodes. Finally, the wafer-level silicon substrate is divided into chip size pieces. At this time, between the pads, the wiring patterns and the bump electrodes are electrically connected by using solder balls, for instance. Similarly to other types of mold packages, such as a ball grid array (BGA) and a chip size package (CSP), manufacturing of the WCSP is performed as an assembly process.

Since such a WCSP is a commodity transacted at the wafer-level as well as the chip size level, both of the chip size and wafer levels are impressed with a commodity description or identification. Commonly, since the pads, the wiring patterns and the bump electrodes are formed on a device surface of the silicon substrate, an impression for the WCSP is performed on a back surface which is opposite from the device surface. A conventional impression method for the WCSP, method is stamp printing using a rubber-stamp. However, the stamp printing has a few disadvantages, for example wear of the stamp and changing of ink. Also, a laser impression that is to be applied to another mold package must be set up, a slowing the process and increasing cost.

At the back surface of a conventional WCSP, since no resist is applied after back-grinding of the WCSP, the silicon substrate is barely formed. When the laser impression is formed in such a WCSP, thermal energy of laser light is conducted at the device surface (a surface of integrated circuit), whereby aluminum wiring is damaged and bonding between aluminum pads and wiring patterns may be destroyed.

SUMMARY OF THE INVENTION

The present invention is therefore directed to providing a method of manufacturing a semiconductor device, which substantially overcome one or more of the problems due to the limitations and disadvantages of the related art.

It is an objective of the invention to provide a semiconductor device and a method of manufacturing the same, whereby a laser impression is formed on, the semiconductor device without any negative effects on the device surface of the semiconductor wafer (chip) due to exothermic heat generated during formation of the laser impression.

To achieve the above noted and other objects, a semiconductor device and a method of manufacturing the same of the present invention includes forming a low thermal conductivity layer on the back surface of the semiconductor wafer (chip), and the laser impression is formed on the low thermal conductivity layer.

According to the present invention, the laser impression can be formed without damaging the device surface of the semiconductor wafer (chip).

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1:
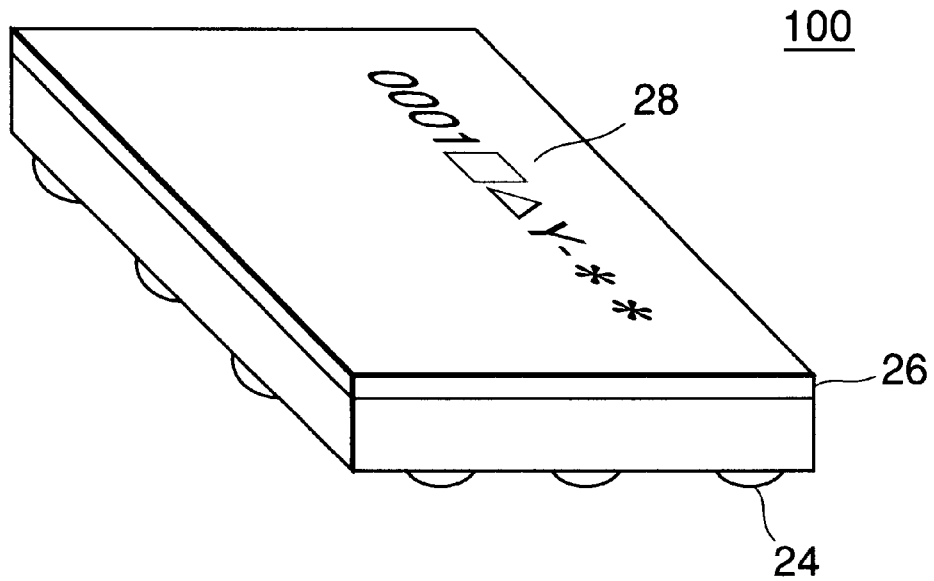
FIG. 1 is an oblique perspective illustration showing a semiconductor device according to a first preferred embodiment of the present invention.
Figure 2:
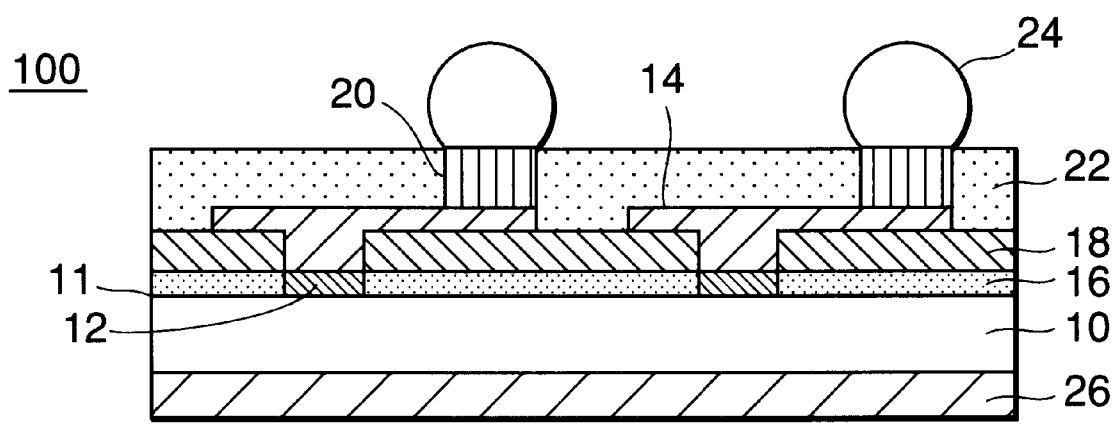
FIG. 2 is a cross-sectional view showing the semiconductor device according to the first preferred embodiment of the present invention.

FIG. 1 is an oblique perspective illustration showing a semiconductor device 100 according to a first preferred embodiment of the present invention. FIG. 2 is a cross-sectional view showing the semiconductor device 100 according to the first preferred embodiment of the present invention. The semiconductor device 100 includes a semiconductor chip 10, a pad electrode 12, a wiring pattern 14, a protection layer 16, an insulating layer 18, a bump electrode 20, resin 22, a solder ball 24, a low thermal conductivity layer 26 and an impression 28. The semiconductor chip 10 indicates a semiconductor substrate having an integrated circuit 11. The pad electrode 12 is formed on the semiconductor chip, and electrically connected to the integrated circuit. Such a pad electrode 12 may be an aluminum or an aluminum alloy for example. The pad electrode 12 may be a copper or a copper alloy for example and is electrically connected to the bump electrode 20, through the wiring pattern 14 may be a copper or a copper alloy. The protection layer 16 protecting a device region may be a nitride layer for example, and is formed on the semiconductor chip 10 as having openings exposing the pad electrode 12. The insulating layer 18 may be a polyimide for example, and is formed on the protection layer 16 as having openings exposing the pad electrode 12 as well as the protection layer 16. As a result, the pad electrode 12 is exposed through the openings of the protection layer 16 and the insulating layer 18.

The wiring pattern 14 and the bump electrode 20 are formed over the insulating layer 18, and are electrically connected to the pad electrode 12. Areas surrounding the wiring pattern 14 and the bump electrode 20 are sealed by the resin 22, however a part of the bump electrode 20 may be exposed. The solder ball 24 as a metal electrode is formed on the exposed region of the bump electrode 20.

The semiconductor chip 10 has a device surface including the integrated circuit 11, the pad electrode 12 and the wiring pattern 14, and a back surface which is opposite from the device surface. The low thermal conductivity layer 26 is formed on the back surface of the semiconductor chip 10. As shown in FIG. 1, the impression 28 which indicates, for example a company name, a product name or a serial number, is impressed on the exposed surface of the low thermal conductivity layer 26 by using a laser. Since the resin 22 and the low thermal conductivity layer 26 are not formed on a side surface of the semiconductor chip 10, the side surface of the semiconductor chip 10 is exposed.

Next, a method of manufacturing such a semiconductor device will be described with reference to FIGS. 3(a) through 3(h).

FIGS. 3(a) through 3(h) are cross-sectional views showing a method of manufacturing the semiconductor device 100 according to a first preferred embodiment of the present invention. A semiconductor wafer 30 is a disciform substrate obtaining by slicing a disciform silicon ingot which is formed by a czochralski method (e.g. a C-Z method). Integrated circuits 11 are formed on the device surface of the semiconductor wafer 30.

Figure 3:
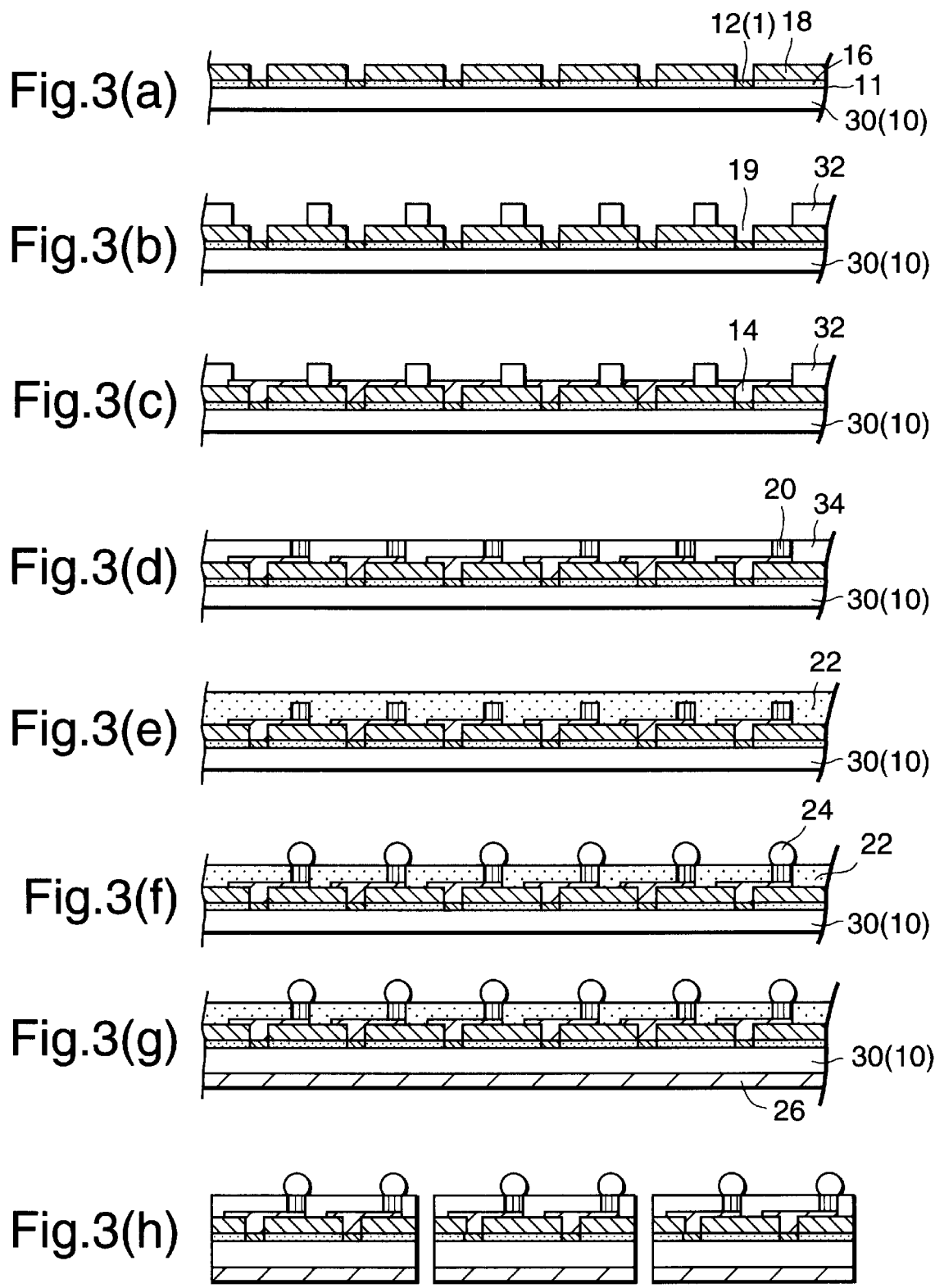
FIGS. 3(a) through 3(h) are cross-sectional views showing a method of manufacturing the semiconductor device according to the first preferred embodiment of the present invention.

As shown in FIG. 3(a), the pad electrodes 12 which are electrically connected to the integrated circuit 11, is formed on the semiconductor wafer 30. The protection layer 16 protecting the integrated circuit 11 and having openings 17 corresponding to locations of the pad electrodes 12, is formed on the semiconductor wafer 30. And, the insulating layer 18 having openings 19 corresponding to locations of the pad electrodes 12, is formed on the protection layer 16. The insulating layer 18 may be a polyimide for example.

Next, as shown in FIG. 3(b), a resist pattern 32 exposing the pad electrodes 12 and portions of insulating layer 18 is formed over the semiconductor wafer 30. The resist patterns 32 are used as a mask pattern when the wiring pattern 14 is formed at a following process step.

Next, as shown in FIG. 3(c), the wiring patterns 14 may be a copper for example, are formed on the basis of the resist pattern 32 by using an electrolytic plating. Thickness and width of the wiring patterns 14 are 5 μm, respectively. The wiring patterns 14 are electrically connected to the pad electrode 12 in the openings.

Next, as shown in FIG. 3(d), a resist pattern 34 exposing parts of the wiring patterns 14, is formed over the semiconductor wafer 30 after the resist pattern 32 is removed. A thickness of the resist pattern 34 is about 100 μm. Bump electrodes 20 are formed at locations corresponding to exposed parts of the wiring patterns 14 by using the resist pattern 34. The bump electrodes 20 may be a copper for example, and may be formed by electrolytic plating so as to electrically connected to the wiring patterns 14 at the exposed parts of the wiring patterns 14. The resist pattern 34 is removed after the bump electrodes 20 are formed.

Next, as shown in FIG. 3(e), the device surface of the semiconductor wafer 30 including the wiring patterns 14 and the bump electrodes 20 is sealed by a resin 22. At this time, the resin 22 covers the wiring patterns 14 and the bump electrodes 20. A thickness of the resin 22 is about 150 μm, and a thickness of the resin 22 on the bump electrode 20 is about 50 μm.

Next, as shown in FIG. 3(f), a surface of the resin 22 is ground by using, for example a grinding blade until the bump electrodes 20 are exposed. Solder balls 24 are formed on the exposed surfaces of the bump electrodes 20. The solder balls 24 are used as metal electrodes for packaging.

Next, as shown in FIG. 3(g), the back surface of the semiconductor wafer 30 which is opposite from the device surface is ground. Then, the low thermal conductivity layer 26 is formed on the ground back surface. Such grinding of the back surface is called a back-grind process.

Next, as shown in FIG. 3(h), the semiconductor wafer is divided into plural chip size devices by using a diamond blade for example. Finally, the impression 28 including various characters (company and product name, a serial number, and so on), is impressed on the low thermal conductivity layer 26 which is formed on the ground back surface of the plurality of chip size devices by using a laser impression method.

In the first preferred embodiment of the present invention, since the low thermal conductivity layer 26 is formed after the device surface of the semiconductor wafer 30 is sealed by the resin 22, the low thermal conductivity layer 26 can be formed as having an impression thereon without damaging the device surface.

Figure 4:
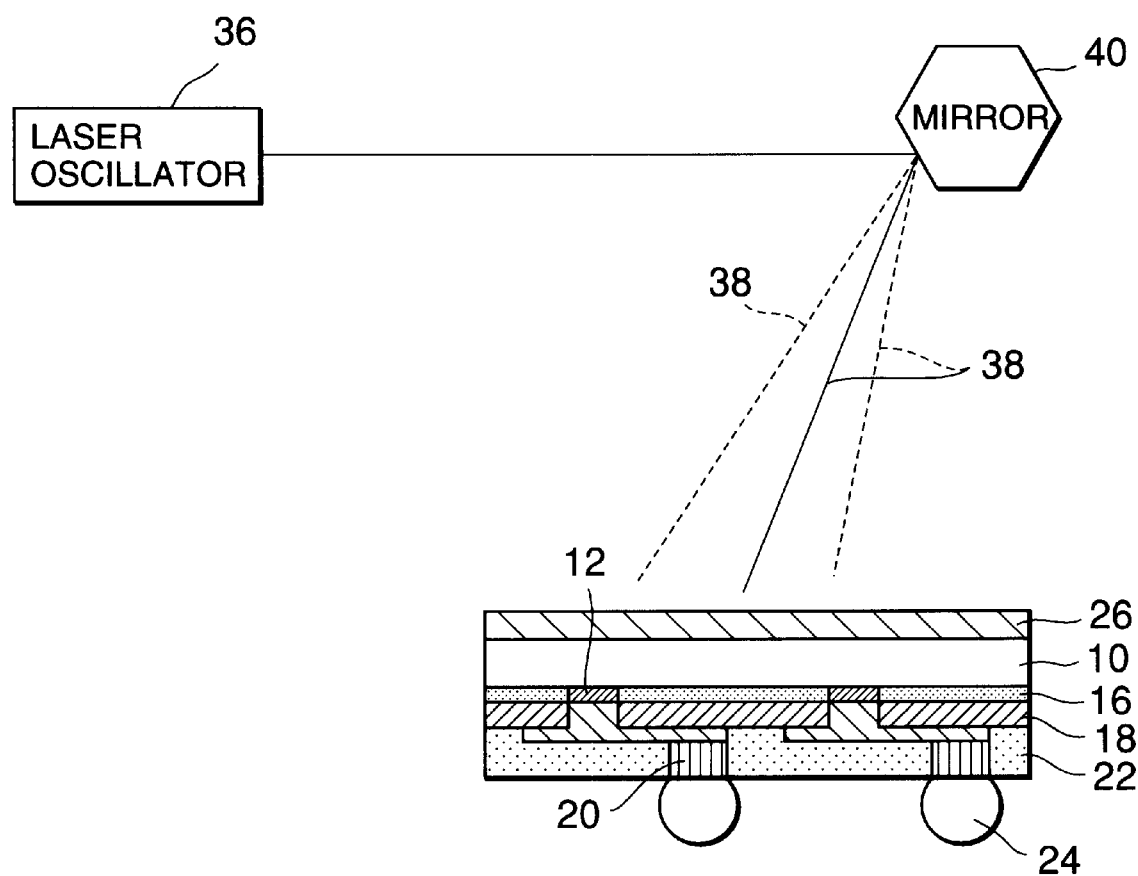
FIG. 4 is an explanation diagram showing formation of a laser impression according to the first preferred embodiment of the present invention.

FIG. 4 is an explanation diagram showing a method of a laser impression according to the first preferred embodiment of the present invention. As shown in FIG. 4, the laser impression is performed by using a laser oscillator 36, for example a yttrium aluminum garnet (YAG) laser. A laser light 38 which is output from the laser oscillator 36 is reflected by a mirror 40, and then exposed on the back surface of the semiconductor chip 10 (the semiconductor device) having the low thermal conductivity layer 26 thereon. Specifically, the impression 28 including various characters is impressed on the low thermal conductivity layer 26 by a scan in response to a movement of the mirror 40 (e.g. a porigon mirror). On the other hand, the impression process may also be performed by a transcription of the various characters which are carved on a glass mask. Specifically, the various characters are transcribed on the low thermal conductivity layer 26 by using such a glass mask as a mask, when the laser light 38 is exposed on the low thermal conductivity layer 26.

In the first preferred embodiment of the present invention, an irradiation condition of such a laser is described below. It should be understood that the following conditions are provided as an example and should not be constructed as limiting, since different conditions may be used to create the laser impression without damaging the chip on which low thermal conductivity layer 26 is formed.

(1) A laser type is a yttrium aluminum garnet laser (YAG laser).

(2) A wavelength of the YAG laser is 1.06 μm.

(3) A strength of the YAG laser is between 740 mJ through 800 mJ.

(4) A scan type of the YAG laser is a 10 kHz flasher.

(5) A scan speed of the YAG laser is between 100 ms/m through 300 ms/m.

Next, a detailed description of the low thermal conductivity layer 26 will be given below. The low thermal conductivity layer 26 has a low thermal conductivity, and is possible to impress characters thereon using a thermal print having a low energy. Specifically, the low thermal conductivity layer 26 has a thermal conductivity lower than that of the semiconductor substrate which may be a silicon for example. Since the thermal conductivity of the low thermal conductivity layer 26 is relatively lower than that of the substrate, an impression may be formed on the low thermal conductivity layer 26 using a lower energy. The low thermal conductivity layer 26 as covered on the device surface having the integrated circuit prevents thermal conductance of heat generated during formation of the laser impression.

The favorable thermal conductivity as such a low thermal conductivity layer 26 is, for example between $10 \times 10^{-4}$(W/m·K) through $10 \times 10^{-2}$(W/m·K), since the thermal conductivity of the silicon is 138.13956 W/m·K (0.33 cal/cm·sec·° C.). In the first preferred embodiment, the most favorable thermal conductivity of the low thermal conductivity layer 26 is between $10 \times 10^{-4}$(W/m·K) through $25 \times 10^{-4}$ (W/m·K). By the way, a printing energy needed to form the impression must increase when such a thermal conductivity is less than $10 \times 10^{-5}$(W/m·K). Also, the thermal conductance on the device surface occurs more easily when such a thermal conductivity is more than $10 \cdot 10^{-2}$(W/m·K). As a result, a dissolution and a peeling of various connections at the pad electrodes 12 for example, the wiring patterns 14, the bump electrodes 20 and the solder balls 24 for example, occur more easily. Furthermore, the wiring pattern 14 is easier to dissolve and peel. The thermal conductivity in the first preferred embodiment indicates various layer's thermal conductivity.

The low thermal conductivity layer 26 may be for example an epoxy resin, a polyethylene resin, a polyester resin, a polyimide resin or a polyurethane resin, as used in a normal packaging process. Also, a thickness of the low thermal conductivity layer 26 is selected in accordance with the packaging type, for example equal to or more than 50 μm. In the first preferred embodiment, the most favorable thickness of the low thermal conductivity layer 26 is between 100 μm through 200 μm.

The low thermal conductivity layer 26 may be formed by coating using a liquid (paste) material, and also by bonding using a film material. The low thermal conductivity layer 26 can be formed fast, by using such forming processes. The coating using a liquid (paste) material is suitable for forming a uniform layer quickly for a comparatively large wafer. On the other hand, the bonding using a film material is suitable for forming a low thermal conductivity layer quickly and cheaply, since management of such a material is easy and requires simple installation.

As such a coating method, there are, for example a spin coating method using a spinner and a paint coating method by using movement of a dispenser. The spin coating method using such a spinner is suitable for forming a uniform layer. On the other hand, the paint coating method using a dispenser is suitable for forming a uniform layer selectively on the semiconductor substrate. Furthermore, other coating methods include a blade coating method, a wire bar coating method, a spray coating method, a bead coating method, an air knife coating method, a curtain coating method, and a coating method which provides a liquid (paste) material down a metal mold setting on the semiconductor substrate. The low thermal conductivity layer 26 is indurate or hardened by pressing, a heating or a light irradiation (e.g. ultraviolet rays).

On the other hand, bonding methods using such a film material may use for example a thermal indurative adhesive (e.g. an epoxy adhesive), a light indurative adhesive or an adhesive tape. These bonding methods are suitable for forming the layer quickly and cheaply.

The thermal conductivity of the low thermal conductivity layer 26 is adjustable by way of section of the above noted various materials. Next, a first example using an epoxy resin as a material is described. The paste epoxy resin is seeped on the back surface of the semiconductor wafer 30 illustrated in FIG. 3(f) for example. Then, the seeped epoxy resin is uniformly spread until a thickness of the epoxy resin is about 200 μm. Next, the semiconductor wafer 30 is put into an electric furnace, and heated within a range of 160° C.~180° C. As a result, the epoxy resin as the low thermal conductivity layer 26 as illustrated in FIG. 3(g) for example, is indurate and formed. The thermal conductivity of such a low thermal conductivity layer 26 is about between $418.605 \times 10^{-4}$ W/m·K through $9209.31 \times 10^{-4}$ W/m·K (between $10 \times 10^{-4}$ cal/cm·sec·° C. through $22 \times 10^{-4}$ cal/cm·sec·° C.).

Next, a second example using a metal mold is described below. The paste epoxy resin is provided down the metal mold setting on the back surface of the semiconductor substrate 30. Then, the metal mold is compressed together until a thickness of the epoxy resin is about 200 μm. Next, the semiconductor wafer 30 is put into an electric furnace, and heated within a range of 160° C.~180° C. As a result, the epoxy resin as the low thermal conductivity layer 26 is indurate and formed. The thermal conductivity of such a low thermal conductivity layer 26 is also about between $418.605 \times 10^{-4}$ W/m·K through $9209.31 \times 10^{-4}$ W/m·K (between $10 \times 10^{-4}$ cal/cm·sec·° C. through $22 \times 10^{-4}$ cal/cm·sec·° C.).

Next, a third example using an indurative ink which is indurate by ultraviolet irradiation (an UV ink) is described below. The UV ink is seeped on the back surface of the semiconductor wafer 30. Then, the seeped epoxy resin is uniformly spread until a thickness of the epoxy resin is about 200 μm. Next, the semiconductor wafer 30 is put into an electric furnace, and heated within a range of 160° C.~180° C. As a result, the UV ink as the low thermal conductivity layer 26 is indurate and formed. The thermal conductivity of such a low thermal conductivity layer 26 is about between $418.605 \times 10^{-4}$ W/m·K through $8372.1 \times 10^{-4}$ W/m·K (between $1 \times 10^{-4}$ cal/cm·sec·° C. through $20 \times 10^{-4}$ cal/cm·sec·° C.).

Figure 5A:
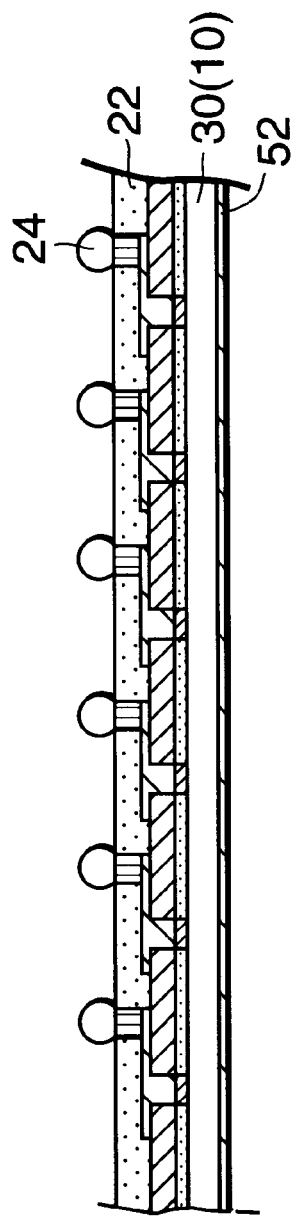
FIGS. 5(a) through 5(c) are cross-sectional views showing an example of manufacturing method of a low thermal conductivity layer.
Figure 5B:
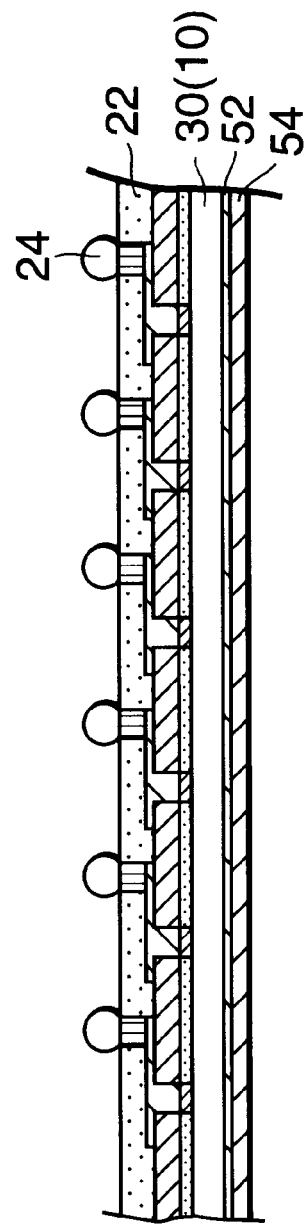
Figure 5C:
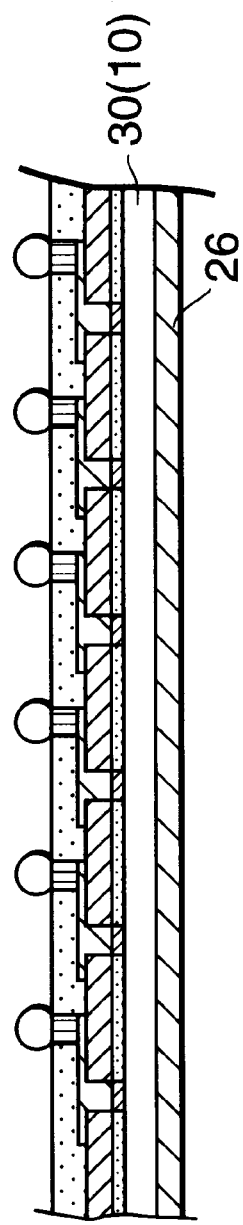

Next, a fourth example using an epoxy adhesive 52 and a low light permeable film 54, for example a polyester film and polyethylene film, is described below. FIGS. 5(a) through 5(c) are cross-sectional views showing an example of a manufacturing method of the low thermal conductivity layer 26. The low light permeable film 54 does not include a carbon and an aluminum.

As shown in FIG. 5(a), the epoxy adhesive 52 is coated on the back surface of the semiconductor wafer 30. Then, as shown in FIG. 5(b), the low light permeable film 54 is superimposed on the epoxy adhesive 52. Next, the semiconductor wafer 30 is put into an electric furnace, and heated to about 150° C. As a result, as shown in FIG. 5(c), the epoxy adhesive 52 and the low light permeable film 54 are bonded, and the low thermal conductivity layer 26 is formed. The thermal conductivity of such a low thermal conductivity layer 26 is about between $2093.025 \times 10^{-4}$ W/m·K through $9209.31 \times 10^{-4}$ W/m·K (between $5 \times 10^{-4}$ cal/cm·sec·° C. through $22 \times 10^{-4}$ cal/cm·sec·° C.).

According to the first preferred embodiment of the present invention, since the low thermal conductivity layer 26 does not readily conduct heat is formed on the back surface of the semiconductor chip 10, the heat of the laser light 38 as illustrated in FIG. 4, is concentrated at the laser irradiation area of the low thermal conductivity layer 26. Since the laser irradiation area of the layer 26 is dissolved, an impression can be formed using a low energy. Furthermore, since the low thermal conductivity layer 26 is formed after a back-grinding process of the semiconductor wafer 30 (the semiconductor chip 10), a better low thermal conductivity layer 26 can be formed without surface concavity and convexity and an interfusion of foreign particle into the layer 26.

As a result, dissolution and peeling between the pad electrodes 12 and the wiring patterns 14, the wiring patterns 14 and the bump electrodes 20, and the bump electrodes 20 and the solder balls 24, can be prevented. Also, the dissolution and peeling of the wiring patterns 14 can be avoided. Furthermore, the integrated circuit which is formed in the device surface of the semiconductor chip 10 can be prevented from being destroyed. Therefore, the laser impression can be formed without a negative effect on the device surface of the semiconductor chip 10 due to exothermic heat of the laser impression.

While the first preferred embodiment of the present invention presents an example in which the laser impression is formed after the semiconductor wafer 30 is divided into plural semiconductor chips 10, the present invention is not limited to this example and the laser impression may be formed prior to dividing the semiconductor wafer 30. Therefore, the commodity transaction with the wafer-level as well as the chip size level can be fulfilled.

Further, while the first preferred embodiment of the present invention presents an example in which the low thermal conductivity layer 26 is formed on the entire back surface of the semiconductor wafer 30 (the semiconductor chip 10), the present invention is not limited to this example and the low thermal conductivity layer 26 may be only formed on the impression area of the back surface.

As described above, the semiconductor device and the method of manufacturing the same according to the present invention can form a laser impression without damaging the device surface of the semiconductor chip.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

What is claimed is:

1. A method of manufacturing a semiconductor device comprising:
    providing a semiconductor substrate having a first surface and a second surface which is opposite from the first surface;
    forming a pad electrode on the first surface of the semiconductor substrate;
    forming an insulating layer covering the first surface of the semiconductor substrate and exposing the pad electrode;
    forming a wiring connected electrically to the pad electrode, on the insulating layer;
    forming a bump electrode on the wiring;
    forming a resin sealing the wiring and the insulating layer, so that a top of the bump electrode is exposed;
    grinding the second surface of the semiconductor substrate;
    forming a low thermal conductivity layer on a ground second surface of the semiconductor substrate;
    dividing the semiconductor substrate into plural semiconductor chip pieces; and
    forming a laser impression on the low thermal conductivity layer of the plural semiconductor chip pieces.

2. The method of manufacturing according to claim 1, wherein the wiring and the bump electrode are formed by an electrolytic plating.

3. The method of manufacturing according to claim 1, further comprising forming a ball electrode on an exposed top of the bump electrode.

4. The method of manufacturing according to claim 1, wherein the forming a low thermal conductivity layer comprises coating a liquid material on the ground second surface of the semiconductor substrate.

5. The method of manufacturing method according to claim 1, wherein the forming a low thermal conductivity layer comprises bonding a film material on the ground second surface of the semiconductor substrate using an adhesive.

6. The method of manufacturing according to claim 1, wherein the low thermal conductivity layer has a thermal conductivity within a range of $10 \times 10^{-4}$ W/m·K $\sim 10 \times 10^{-2}$ W/m·K.

7. A method of manufacturing a semiconductor device comprising:
    providing a semiconductor substrate having a first surface and a second surface which is opposite from the first surface;
    forming a pad electrode on the first surface of the semiconductor substrate;
    forming an insulating layer covering the first surface of the semiconductor substrate and exposing the pad electrode;
    forming a wiring connected electrically to the pad electrode, on the insulating layer;
    forming a bump electrode on the wiring;
    forming a resin sealing the wiring and the insulating layer, so that a top of the conductor is exposed;
    grinding the second surface of the semiconductor substrate; forming a low thermal conductivity layer on a ground second surface of the semiconductor substrate;
    forming a laser impression on the low thermal conductivity layer; and
    dividing the semiconductor substrate having the laser impression into plural semiconductor chip pieces.

8. The method of manufacturing according to claim 7, wherein the wiring and the bump electrode are formed by an electrolytic plating.

9. The manufacturing method according to claim 7, further comprising forming a ball electrode on an exposed top of the bump electrode.

10. The method of manufacturing according to claim 7, wherein the forming a low thermal conductivity layer comprises coating a liquid material on the ground second surface of the semiconductor substrate.

11. The method of manufacturing method according to claim 7, wherein the forming a low thermal conductivity layer comprises bonding a film material on the ground second surface of the semiconductor substrate using an adhesive.

12. The manufacturing method according to claim 7, wherein the forming a low thermal conductivity layer has a thermal conductivity within a range of $10\times10^{-4}$ W/m·K~$10\times10^{-2}$ W/m·K.

13. A method of manufacturing a semiconductor device comprising:

proviing a semiconductor substrate having a first surface and a second surface which is opposite from the first surface;

forming a pad electrode on the first surface of the semiconductor substrate;

forming an insulating layer covering the first surface of the semiconductor substrate and exposing the pad electrode;

forming a conductor having first and second portions connected electrically to the pad electrode, on the insulating layer;

forming a resin sealing the first portion of the conductor and the insulating layer, so that the second portion of the conductor is exposed;

grinding the second surface of the semiconductor substrate;

forming a low thermal conductivity layer on a ground second surface of the semiconductor substrate;

dividing the semiconductor substrate into plural semiconductor chip pieces; and forming a laser impression on the low thermal conductivity layer of the plural semiconductor chip pieces.

14. The method of manufacturing according to claim 13, wherein the conductor is formed by an electrolytic plating.

15. The method of manufacturing according to claim 13, further comprising forming a ball electrode on the second portion of the conductor.

16. The method of manufacturing according to claim 13, wherein the forming a low thermal conductivity layer comprises coating a liquid material on the ground second surface of the semiconductor substrate.

17. The method of manufacturing method according to claim 13, wherein the forming a low thermal conductivity layer comprises bonding a film material on the ground second surface of the semiconductor substrate using an adhesive.

18. The method of manufacturing according to claim 13, wherein the low thermal conductivity layer has a thermal conductivity within a range of $10\times10^{-4}$ W/m·K~$10\times10^{-2}$ W/m·K.

19. A method of manufacturing a semiconductor device comprising:

providing a semiconductor substrate having a first surface and a second surface which is opposite from the first surface;

forming a pad electrode on the first surface of the semiconductor substrate;

forming an insulating layer covering the first surface of the semiconductor substrate and exposing the pad electrode;

forming a conductor having first and second portions connected electrically to the pad electrode, on the insulating layer;

forming a resin sealing the first portion of the conductor and the insulating layer, so that the second portion of the conductor is exposed;

grinding the second surface of the semiconductor substrate;

forming a low thermal conductivity layer on a ground second surface of the semiconductor substrate;

forming a laser impression on the low thermal conductivity layer; and dividing the semiconductor substrate having the laser impression into plural semiconductor chip pieces.

20. The method of manufacturing according to claim 19, wherein the conductor is formed by an electrolytic plating.

21. The method of manufacturing according to claim 19, further comprising forming a ball electrode on the second portion of the conductor.

22. The method of manufacturing according to claim 19, wherein the forming a low thermal conductivity layer comprises coating a liquid material on the ground second surface of the semiconductor substrate.

23. The method of manufacturing method according to claim 19, wherein the forming a low thermal conductivity layer comprises bonding a film material on the ground second surface of the semiconductor substrate using an adhesive.

24. The method of manufacturing according to claim 19, wherein the low thermal conductivity layer has a thermal conductivity within a range of $10\times10^{-4}$ W/m·K~$10\times10^{-2}$ W/m·K.

* * * * *